(12) United States Patent
Hong et al.

(10) Patent No.: US 10,056,917 B2
(45) Date of Patent: Aug. 21, 2018

(54) DATA COMPRESSION DEVICE AND METHOD USING FLOATING POINT FORMAT

(71) Applicant: SOLiD, Inc., Seongnam-si, Gyeonggi-do (KR)

(72) Inventors: Donghoon Hong, Seoul (KR); Hosik Jang, Seongman-si (KR); Youngin Kim, Seoul (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 15/397,921

(22) Filed: Jan. 4, 2017

(65) Prior Publication Data
US 2017/0194986 A1 Jul. 6, 2017

(30) Foreign Application Priority Data
Jan. 4, 2016 (KR) .................. 10-2016-0000667

(51) Int. Cl.
*H03M 7/30* (2006.01)
*G06F 7/485* (2006.01)
*G06F 7/556* (2006.01)
*G06F 7/48* (2006.01)

(52) U.S. Cl.
CPC .............. *H03M 7/30* (2013.01); *G06F 7/485* (2013.01); *G06F 7/4824* (2013.01); *G06F 7/556* (2013.01)

(58) Field of Classification Search
CPC .......................... H03M 7/30; H03M 7/3059
See application file for complete search history.

(56) References Cited

U.S. PATENT DOCUMENTS

| 2003/0161278 A1* | 8/2003 | Igura ............... H04J 13/00 370/320 |
| 2015/0358030 A1* | 12/2015 | Xia ............... H03M 7/3082 341/87 |
| 2017/0054449 A1* | 2/2017 | Mani ............... H03M 7/4075 |

FOREIGN PATENT DOCUMENTS

| KR | 10-2010-0089459 A | 2/2009 |
| KR | 10-2013-0124604 A | 11/2013 |

* cited by examiner

*Primary Examiner* — Matthew Sandifer
(74) *Attorney, Agent, or Firm* — Sughrue Mion, PLLC

(57) ABSTRACT

A data compression device includes an analog to digital converter (ADC) configured to convert an analog signal into a digital signal including in-phase and quadrature components; and a compressor configured to generate a 28-bit fixed-point digital signal in which bits of the in-phase and quadrature components are alternately arranged, generate an exponent bit string by comparing n most significant bits of a data bit string excluding two sign bits in the 28-bit fixed-point digital signal with preset mapping data, wherein the exponent bit string includes 4 bits, generate a mantissa bit string composed of 14 bits corresponding to up to $14^{th}$ bit from a bit next to the n most significant bits of the data bit string, and generate a 20-bit floating point digital signal by combining the two sign bits, the exponent bit string, and the mantissa bit string, wherein n is a natural number equal to or greater than 2 and equal to or less than 12.

13 Claims, 6 Drawing Sheets

Fs : Sampling Frequence

FIG. 4

| N | M | Mapping Bit | Bit Loss |
|---|---|---|---|
| 0 | 0000 | 10 | 5/5 |
| 1 | 0001 | 11 | 5/5 |
| 2 | 0010 | 010 | 4/5 |
| 3 | 0011 | 011 | 4/5 |
| 4 | 0100 | 0010 | 4/4 |
| 5 | 0101 | 0011 | 4/4 |
| 6 | 0110 | 00010 | 3/4 |
| 7 | 0111 | 00011 | 3/4 |
| 8 | 1000 | 00001 | 3/4 |
| 9 | 1001 | 000001 | 3/3 |
| 10 | 1010 | 0000001 | 2/3 |
| 11 | 1011 | 00000001 | 2/2 |
| 12 | 1100 | 000000001 | 1/2 |
| 13 | 1101 | 0000000001 | 1/1 |
| 14 | 1110 | 00000000001 | 0/1 |
| 15 | 1111 | 000000000001 | 0/0 |

DATA COMPRESSION DEVICE AND METHOD USING FLOATING POINT FORMAT

CROSS-REFERENCE TO RELATED APPLICATION

This application claims priority from Korean Patent Application No. 10-2016-0000667, filed on Jan. 4, 2016, in the Korean Intellectual Property Office, the disclosure of which is incorporated herein in its entirety by reference.

BACKGROUND

1. Field

The inventive concept relates to a data compression device and a method using a floating point format, and more particularly, to a data compression device and a method capable of minimizing loss of data.

2. Description of the Related Art

In general, repeaters are used to transmit signals from a base station to a terminal and to mitigate a shadow area. A digital optical repeater, which is one of such repeaters, includes a main hub unit (MHU) receiving a signal from a base station and a remote optical unit (ROU) performing a repeat function at a lower end of the MHU, and performs a communication service for transmitting data to a shadow area through digital light.

Some digital optical repeaters compress and transmit data in a floating point format to increase transmission efficiency when transmitting data. The floating point format may represent data by dividing it into a sign portion, an exponent portion, and a mantissa portion. In order to minimize loss of data when the data is compressed by the floating point format, the number of bits in the exponent portion capable of representing an input size of a compression device needs to be sufficient. If the number of bits of the exponent portion is insufficient, the data may be seriously distorted. Therefore, it is general to reduce the number of bits in the mantissa portion to increase data compression efficiency. However, if the number of bits in the mantissa portion is reduced, the number of valid bits is reduced, thereby transmitting incorrect data. Therefore, there is a need for a method capable of reducing loss of data.

SUMMARY

The inventive concept is directed to a data compression device and a method capable of reducing loss of data.

Additional aspects will be set forth in part in the description which follows and, in part, will be apparent from the description, or may be learned by practice of the presented example embodiments.

According to an aspect of the inventive concept, there is provided a data compression device, the data compression device includes: an analog to digital converter (ADC) configured to convert an analog signal into a digital signal including in-phase and quadrature components; and a compressor configured to generate a 28-bit fixed-point digital signal in which bits of the in-phase and quadrature components are alternately arranged, generate an exponent bit string by comparing n most significant bits of a data bit string excluding two sign bits in the 28-bit fixed-point digital signal with preset mapping data, wherein the exponent bit string includes 4 bits, generate a mantissa bit string composed of 14 bits corresponding to up to $14^{th}$ bit from a bit next to the n most significant bits of the data bit string, and generate a 20-bit floating point digital signal by combining the two sign bits, the exponent bit string, and the mantissa bit string, wherein n is a natural number equal to or greater than 2 and equal to or less than 12.

According to an exemplary embodiment, wherein, if there is no mapping bit string corresponding to the n most significant bits in the mapping data, the compressor may be configured to determine whether there are mapping bit string corresponding to n+1 most significant bits and generate the exponent bit string.

According to an exemplary embodiment, wherein the mapping data may include two mapping bit strings corresponding to two bits.

According to an exemplary embodiment, wherein the mapping data may include two mapping bit strings corresponding to three bits.

According to an exemplary embodiment, wherein the mapping data may include two mapping bit strings corresponding to four bits.

According to an exemplary embodiment, wherein the mapping data may include three mapping bit strings corresponding to five bits.

According to another aspect of the inventive concept, there is provided a data decompression device, the data decompression device includes: a decompressor configured to, if a 20-bit floating point digital signal composed of two sign bits, a 4-bit exponent bit string, and a 14-bit mantissa bit string is received, generate n most significant bits by comparing the 4-bit exponent bit string with preset mapping data, and generate and output a 28-bit fixed-point digital signal in which bits of in-phase and quadrature components are alternately arranged by combining the two sign bits, the 14-bit mantissa bit strings and the n most significant bits; and a digital to analog converter (DAC) configured to convert the 28-bit fixed-point digital signal into an analog signal, wherein n is a natural number equal to or greater than 2 and equal to or less than 12.

According to an exemplary embodiment, wherein the mapping data may include two mapping bit strings corresponding to two bits.

According to an exemplary embodiment, wherein the mapping data may include two mapping bit strings corresponding to three bits.

According to an exemplary embodiment, wherein the mapping data may include two mapping bit strings corresponding to four bits.

According to an exemplary embodiment, wherein the mapping data may include three mapping bit strings corresponding to five bits.

According to an exemplary embodiment, wherein, when a value obtained by combining the two sign bits, the 14-bit mantissa bit string, and the n most significant bits is less than 28 bits, the decompressor may be configured to generate a lost bit string corresponding to the number of insufficient bits, and generate the 28-bit fixed-point digital signal by combining the two sign bits, the n-most significant bits, the 14-bit mantissa bit string, and the lost bit string, wherein a most significant bit of the in-phase component or the quadrature component constituting the lost bit string corresponds to HIGH.

According to an exemplary embodiment, wherein up to a least significant bit from a next most significant bit each of the in-phase and quadrature components constituting the lost bit string may correspond to LOW.

According to the inventive concept, a data compression device and a method capable of reducing loss of data may be provided.

BRIEF DESCRIPTION OF THE DRAWINGS

These and/or other aspects will become apparent and more readily appreciated from the following description of the example embodiments, taken in conjunction with the accompanying drawings in which:

FIG. 4 is an exemplary view of mapping data according to an example embodiment of the inventive concept;

DETAILED DESCRIPTION

Figure 1:
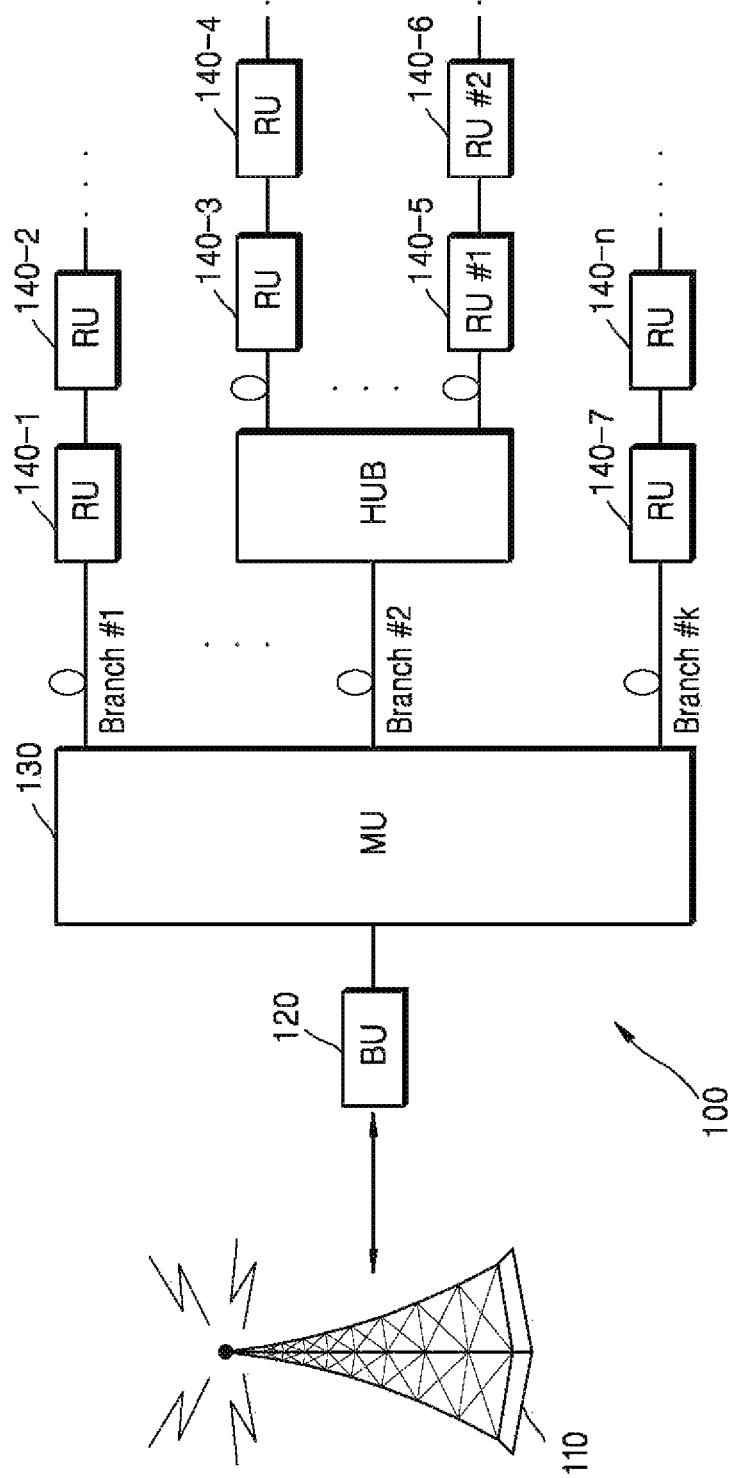
FIG. 1 is a block diagram of a data compression system according to an example embodiment of the inventive concept.

The inventive concept may be variously modified and have various example embodiments, so that specific example embodiments will be illustrated in the drawings and described in the detailed description. However, this does not limit the inventive concept to specific example embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the inventive concept. In addition, numeral figures (for example, 1, 2, and the like) used during describing the specification are just identification symbols for distinguishing one element from another element.

Further, in the specification, if it is described that one component is "connected" or "accesses" the other component, it is understood that the one component may be directly connected to or may directly access the other component but unless explicitly described to the contrary, another component may be "connected" or "access" between the components.

In addition, terms including "unit", "er", "or", "module", and the like disclosed in the specification mean a unit that processes at least one function or operation and this may be implemented by hardware or software such as a processor, a microprocessor, a microcontroller, a central processing unit (CPU), a graphics processing unit (GPU), an accelerated Processing unit (APU), a digital signal processor (DSP), an application specific integrated circuit (ASIC), and a field programmable gate array (FPGA) or a combination of hardware and software.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

A distributed antenna system according to an example embodiment of the inventive concept is a coverage system for an in-building service that delivers voice communication and data communication with high quality and seamlessness. It is also a system for servicing analog and digital telephone systems serviced in multiple bands with one antenna. The antenna system may be installed in general public institutions and private facilities such as a shopping mall, a hotel, a campus, an airport, a hospital, a subway, a sports complex, and a convention center. The distributed antenna system improves a poor propagation environment in a building, improves a poor received signal strength indication (RSSI) and the overall reception sensitivity of a mobile terminal, chip energy/other interferences (Ec/Io), and provides a mobile communication service to every corner of the building so that a user of the mobile communication service can freely talk anywhere in the building. The distributed antenna system may support a worldwide mobile communication standard.

For example, the distributed antenna system may support a time division duplex (TDD) service as well as a frequency division duplex (FDD) service, a very-high frequency (VHF), an ultra-high frequency (UHF), and frequencies of 700 MHz, 800 MHz, 850 MHz, 900 MHz, 1900 MHz, 2100 MHz, and 2600 MHz bands. Furthermore, the distributed antenna system may support a number of mobile communication standards such as a typical analog mobile communication service, that is, an advanced mobile phone service (AMPS), digital time-division multiple access (TDMA), code-division multiple access (CDMA), wideband code-division multiple access (WCDMA), high-speed downlink packet access (HSDPA), long-term evolution (LTE), LTE-advanced (LTE-A), and so on.

Hereinafter, example embodiments of the inventive concept will be described in detail.

FIG. 1 is a block diagram of a data compression system 100 according to an example embodiment of the inventive concept.

Referring to FIG. 1, the data compression system 100 may be implemented by a distributed antenna system (DAS). Here, the data compression system 100 includes a base station interface unit 120 and a master unit 130 constituting a head-end node, a hub unit 150 constituting an extension node, and a plurality of remote units 140-1, 140-2, . . . 140-n (where n is a natural number) (sometimes referred to collectively as 140-n) disposed at respective remote service locations and constituting a remote node. Such a distributed antenna system may be implemented by an analog DAS or a digital DAS, and in some cases may be implemented by a mixed form thereof (e.g., some nodes perform analog processing and the other nodes perform digital processing).

FIG. 1 shows an example of a topology of the data compression system 100 implemented by a distributed antenna system and various topology variations are possible in the data compression system 100 considering specificity of installation areas and application fields (e.g., in-building, a subway, a hospital, a stadium, etc.). In this regard, the number of a base station interface unit (BIU) 120, a MU 130, a HUB 150, the RUs 140-n, and a connection relationship between and lower ends thereof may be different from those of FIG. 1. Furthermore, in the data compression system 100, the HUB 150 is utilized when the number of branches to be branched from the MU 130 into a star structure is limited compared to the number of RUs 140-n to be installed. Therefore, the HUB 150 may be omitted when the number of RUs 140-n to be installed may be sufficiently satisfied even with a single MU 130, or when a plurality of MUs 130 are installed. Hereinafter, respective components in a distributed antenna system applicable to the inventive concept and their functions will be sequentially described with reference to the topology of FIG. 1.

The BIU 120 functions as an interface between the BTS 110 of a base station and the MU 130 in the data compression system 100. FIG. 1 shows a case where a single BTS 110 is connected to a single BIU 120. However, the BIU 120 may be provided for each service provider, each frequency band, and each sector.

In general, since a radio frequency (RF) signal transmitted from the BTS 110 is a high-power signal, the BIU 120 converts the high-power RF signal into a signal having a power suitable for processing by the MU 130 and transmits the RF signal to the MU 130. Furthermore, as illustrated in FIG. 1, the BIU 120 may also receive signals of a mobile communication service for each frequency band (or for each service provider or each sector) and combine the signals, and may transmit the combined signals to the MU 130.

When the BIU 120 lowers the high-power signal of the BTS 110 to low-power signals and then combines the mobile communication service signals to transmit the combined signals to the MU 130, the MU 130 distributes the combined and transmitted mobile communication service signals for each branch. Here, when the data compression system 100 is implemented by a digital DAS, the BIU 120 includes a component that converts high-power RF signals of the BTS 110 into low-power RF signals, and a component that converts the low-power RF signals into intermediate frequency (IF) signals and then performs digital signal processing on the IF signals and combining the same. However, the digital signal processing may be directly performed on the RF signals without converting the RF signals into the IF signals. Alternatively, when the BIU 120 only lowers the high-power signal of the BTS 110 to low-power signals, the MU 130 combines the respective transmitted mobile communication service signals and distributes the combined signals for each branch.

The mobile communication service signals distributed from the MU 130 are transmitted to the RUs 140-n directly or via the HUB 150 for each branch (see Branch #1, Branch #2, . . . Branch #k of FIG. 1, where k is a natural number). Each of the RUs 140-n separates received combined repeat signals by frequency band and performs signal processing (analog signal processing in a case of an analog DAS and digital signal processing in a case of a digital DAS). Accordingly, each of the RUs 140-n transmits a repeat signal to a mobile communication terminal in its service coverage through a service antenna.

FIG. 1 shows a case where an RF cable is connected between the BTS 110 and the BIU 120 and between the BIU 120 and the MU 130, and an optical cable is connected from the MU 130 to a lower end thereof. However, a signal transmission medium between nodes may be variously modified. For example, the BIU 120 and the MU 130 may be connected through an RF cable, or may be connected through an optical cable or a digital interface. As another example, an optical cable may be connected between the MU 130 and the HUB 150 and between RUs 140-n directly connected to the MU 130, and cascade-connected RUs 140-n may be connected to each other by an RF cable, a twisted cable, an unshielded twisted pair (UTP) cable, or the like. As another example, the RUs 140-n directly connected to the MU 130 may also be connected to each other by an RF cable, a twisted cable, a UTP cable, or the like.

Furthermore, FIG. 1 shows a case where the BIU 120 is located between the BTS 110 and the MU 130. However, the BIU 120 may be formed as a functional part of the MU 130. The BIU 120 may be omitted if a signal input from the BTS 110 is not a high-power signal. Furthermore, the BIU 120 may be a functional part in the MU 130 instead of a separate device as illustrated in FIG. 1. In this case, the MU 130 may convert high-power RF signals input from the BTS 110 into low-power signals, and then may combine the converted RF signals for each frequency band (or for each sector or each sector). However, as illustrated in FIG. 1, the MU 130, the HUB 150, and the RUs 140-n may include an optical transceiver module for electro-optical conversion/photo-electric conversion, and may include a wavelength division multiplexing (WDM) device when nodes are connected to each other by a single optical cable.

Meanwhile, mobile communication service signals transmitted and received between the MU 130, the HUB 150, and the RUs 140-n may be compressed. That is, the MU 130 may compress and transmit mobile communication service signals according to a predetermined method when the mobile communication service signals are distributed to the HUB 150 and/or the RUs 140-n (forward direction). Accordingly, the RUs 140-n may decompress the compressed mobile communication service signals (hereinafter, referred to as 'compressed signals') according to a predetermined method, and process the signals. The HUB 150 may also decompress the received compressed signals if necessary. On the other hand, the RUs 140-n may compress and transmit mobile communication service signals according to a predetermined method when the mobile communication service signals are distributed to the HUB 150 and/or the MU 130 (reverse direction). Accordingly, the MU 130 may decompress the compressed signals according to a predetermined method and process the signals. The HUB 150 may also decompress the received compressed signals if necessary. Hereinafter, a method of generating an compressed signal by each component of the data compression system 100 and a method of decompressing the compressed signal will be described in detail with reference to FIGS. 2 through 9, according to an example embodiment of the inventive concept.

Figure 2:
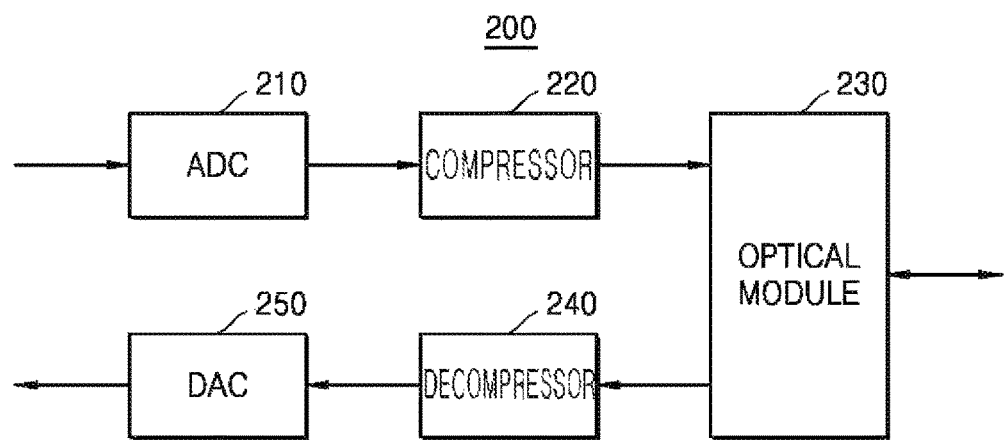
FIG. 2 is a block diagram of a data compression device according to an example embodiment of the inventive concept.

FIG. 2 is a block diagram of a data compression device 200 according to an example embodiment of the inventive concept.

Referring to FIG. 2, the data compression device 200 includes an analog to digital converter (ADC) 210, a compressor 220, an optical module 230, a decompressor 240, and a digital to analog converter (DAC) 250. The data compression device 200 may be any one of the MU 130, the RUs 140-n, and/or the HUB 150 of FIG. 1. In addition, when the data compression device 200 is implemented as a communication device, the data compression device 200 may further include a signal receiver (not shown) for receiving a mobile communication service signal from another device, an analog signal processor (not shown) for processing a mobile communication service signal which is an analog signal, a digital signal processor (not shown) for processing a mobile communication service signal converted into a digital signal, or the like. Hereinafter, it is assumed that the data compression device 200 is implemented by the MU 130. Furthermore, operations of compressing and decompressing an input signal by the data compression device 200 will be mainly described.

First, the ADC 210 converts an input analog signal into a digital signal including an in-phase component and a quadrature component. For example, the ADC 210 may digitally sample an analog signal received from the BTS 110 and convert it into a digital signal including in-phase/quadrature (I/Q) components. The digital signal converted by the ADC 210 may be composed of a 14-bit in-phase component and a 14-bit quadrature component.

Figure 3:
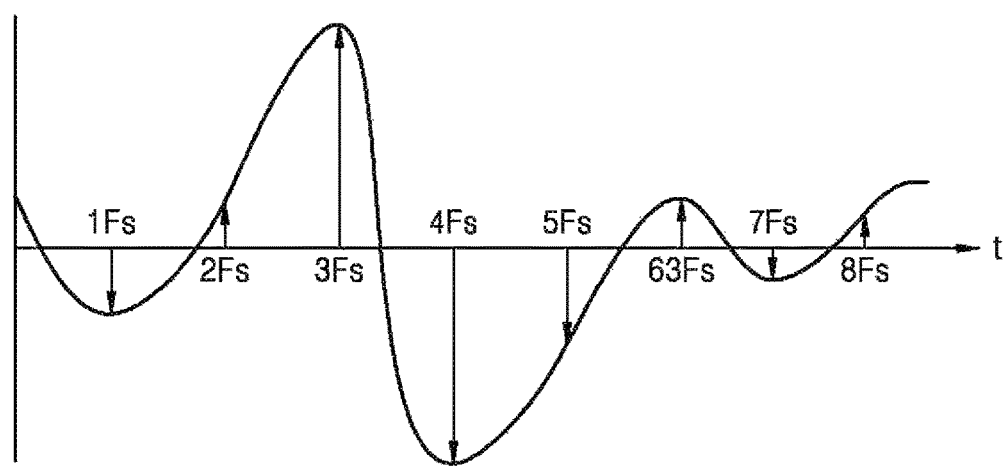
FIG. 3 is a view of sampling of an analog signal in a data compression device, according to an example embodiment of the inventive concept.

FIG. 3 is a view of sampling of an analog signal in the data compression device 200, according to an example embodiment of the inventive concept. FIG. 3 shows a case where the ADC 210 converts an input analog signal into a digital signal by using a sampling frequency (Fs). For example, when the input analog signal is a signal of orthogonal frequency-division multiplexing (OFDM), the ADC 210 may convert the signal into a digital signal including I/Q components. Also, the ADC 210 may output the converted digital signal to the compressor 220.

The compressor 220 may compress a 28-bit fixed-point digital signal of I/Q components into a 20-bit floating-point digital signal. For example, the compressor 220 may generate a 28-bit fixed-point digital signal by alternately arranging bits of a 14-bit in-phase component and a 14-bit quadrature component. Here, one bit of the 14-bit in-phase component may be a sign bit indicating that the corresponding bit string is an in-phase component. Also, one bit of the 14-bit quadrature component may be a sign bit indicating that the corresponding bit string is a quadrature component. Since the sign bits are not involved in bit compression, only 26 bits excluding the sign bit will be described later below.

The compressor 220 may generate a 4-bit exponent bit string by comparing n most significant bits of the 26-bit fixed-point digital signal with predetermined mapping data (where n is a natural number equal to or greater than 2 and equal to or less than 12).

FIG. 4 is an exemplary view of mapping data according to an example embodiment of the inventive concept. Referring to FIG. 4, the mapping data includes 16 mapping bits.

Here, the compressor 220 may generate 'LOW LOW LOW LOW (0000)' as the exponent bit string when 2 most significant bits of 26-bit fixed-point digital signal correspond to 'HIGH LOW (10)'. Also, the compressor 220 may generate 'LOW LOW LOW HIGH (0001)' as the exponent bit string when the 2 most significant bits of 26-bit fixed-point digital signal correspond to 'HIGH HIGH (11)'.

Furthermore, when the 2 most significant bits of 26-bit fixed-point digital signal correspond to 'LOW HIGH (01)', there is no mapping bit string corresponding to pre-stored mapping data. Here, the compressor 220 may determine whether there is a mapping bit string corresponding to 3 most significant bits of the 26-bit fixed-point digital signal. The compressor 220 may generate 'LOW LOW HIGH LOW (0010)' as the exponent bit string when the 3 most significant bits correspond to 'LOW HIGH LOW (010)'. Also, the compressor 220 may generate 'LOW LOW HIGH HIGH (0011)' as the exponent bit string when the 3 most significant bits of the 26-bit fixed-point digital signal corresponds to 'LOW HIGH HIGH (011)'.

If there is no mapping bit string corresponding to the mapping data in up to 11 most significant bits of the 26-bit fixed-point digital signal in the above method, the compressor 220 may determine whether a mapping bit string corresponding to 12 most significant bits of the 26-bit fixed-point digital signal are included in the mapping data. The compressor 220 may generate 'HIGH HIGH HIGH HIGH (1111)' as the exponent bit string when the 12 most significant bits of the 26-bit fixed-point digital signal correspond to 'LOW LOW LOW LOW LOW LOW LOW LOW LOW LOW LOW HIGH (000000000001)'.

A mapping bit string corresponding to 'LOW LOW LOW LOW LOW LOW LOW LOW LOW LOW LOW LOW (000000000000)' is not set in the mapping data of FIG. 4. Since the exponent bit string is composed of four bits, the n most significant bits may be represented 16 kinds of bit strings by the exponent bit string. Therefore, according to an example embodiment, any one of the mapping bit string in FIG. 4 is deleted and a mapping bit string corresponding to 'LOW LOW LOW LOW LOW LOW LOW LOW LOW LOW LOW LOW (000000000000)' may be included in the mapping data. For example, a mapping bit string corresponding to 'HIGH HIGH (11)' of the mapping bit string in FIG. 4 are deleted and a mapping bit string corresponding to 'LOW LOW LOW LOW LOW LOW LOW LOW LOW LOW LOW LOW (000000000000)' may be included in the mapping data. Here, the compressor 220 may generate an exponent bit string corresponding to 'LOW LOW LOW HIGH (0001)' if the 12 most significant bits of the 26-bit fixed-point digital signal correspond to 'LOW LOW LOW LOW LOW LOW LOW LOW LOW LOW LOW LOW (000000000000)'. As described above, the mapping data of FIG. 4 is merely an example, and thus types of mapping bit strings set in the mapping data do not limit the scope of the inventive concept.

Meanwhile, a floating-point digital signal generated by the compressor 220 is a 20-bit floating-point digital signal. Two bits of the generated 20-bit floating-point digital signal correspond to sign bits, so that the number of bits related to actual compression is 18. Since 4 bits of the 18 bits correspond to the exponent bit string, a mantissa bit string will correspond to 14 bits. Therefore, the pre-stored mapping data may include up to only mapping bits corresponding to 12 bits. This is because there is no bit loss when the 12 most significant bits of the 26-bit fixed-point digital signal correspond to 'LOW LOW LOW LOW LOW LOW LOW LOW LOW LOW LOW HIGH (000000000001)'. On the other hand, if the 2 most significant bits of the 26-bit fixed-point digital signal correspond to 'HIGH LOW (10)', 5 bits of an in-phase component and 5 bits of a quadrature component, i.e., a total of 10 bits may be lost. Here, the mapping data may be pre-stored in a storage space.

Furthermore, as shown in FIG. 4, the pre-stored mapping data may include two mapping bit strings corresponding to two bits. Also, the pre-stored mapping data may include two mapping bit strings corresponding to three bits. The pre-stored mapping data may include two mapping bit strings corresponding to four bits. The pre-stored mapping data may include three mapping bit strings corresponding to five bits. According to the related art, when a fixed-point digital signal is compressed into a floating-point digital signal, an exponent bit string is generated by detecting a bit string in which a bit corresponding to 'HIGH' is firstly read among the bit strings represented by the n most significant bits (hereinafter, referred to as a conventional method). That is, in the conventional method, if the most significant bit of the 26-bit fixed-point digital signal corresponds to 'HIGH', the exponent bit string corresponding to 'LOW LOW LOW' is generated, if the second bit corresponds to 'HIGH', the exponent bit string corresponding to 'HIGH HIGH HIGH' is generated, and if the eighth bit corresponds to 'HIGH', the exponent bit string corresponding to 'HIGH HIGH HIGH' is generated.

Since the mantissa bit string is set to 14 bits in advance according to an embodiment of the inventive concept, if only the 12 most significant bits are represented as the exponent bit string, there is no bit loss in a 26-bit fixed point digital signal. Since the exponent bit string is set to 4 bits, it is possible to represent up to the 16 most significant bits. There will be no bit loss if only the 12 bit strings are represented. Therefore, two mapping bit strings corresponding to the two most significant bits are included in the mapping data in an example embodiment of the inventive concept. According to the conventional method, when the most significant bit is 'HIGH', the second bit is included in the mantissa bit string without distinguishing between 'HIGH LOW' and 'HIGH HIGH', but in an example embodiment of the inventive concept, it is possible to distinguish two bit strings represented by the 2 most significant bits as 'HIGH LOW' and 'HIGH HIGH'. Whereby bit loss may be minimized. This is because bits to be included in the mantissa bit string may be included in the exponent bit string.

For the same reason, in an example embodiment of the inventive concept, two mapping bit strings corresponding to the three most significant bits are included (to distinguish between LOW HIGH HIGH and LOW HIGH LOW), two mapping bit strings corresponding to the four most significant bits are included (to distinguish between LOW LOW HIGH LOW and LOW LOW HIGH HIGH), and three mapping bit strings corresponding to the five most significant bits are included (to distinguish between LOW LOW LOW HIGH LOW and LOW LOW LOW HIGH HIGH).

Figure 5:
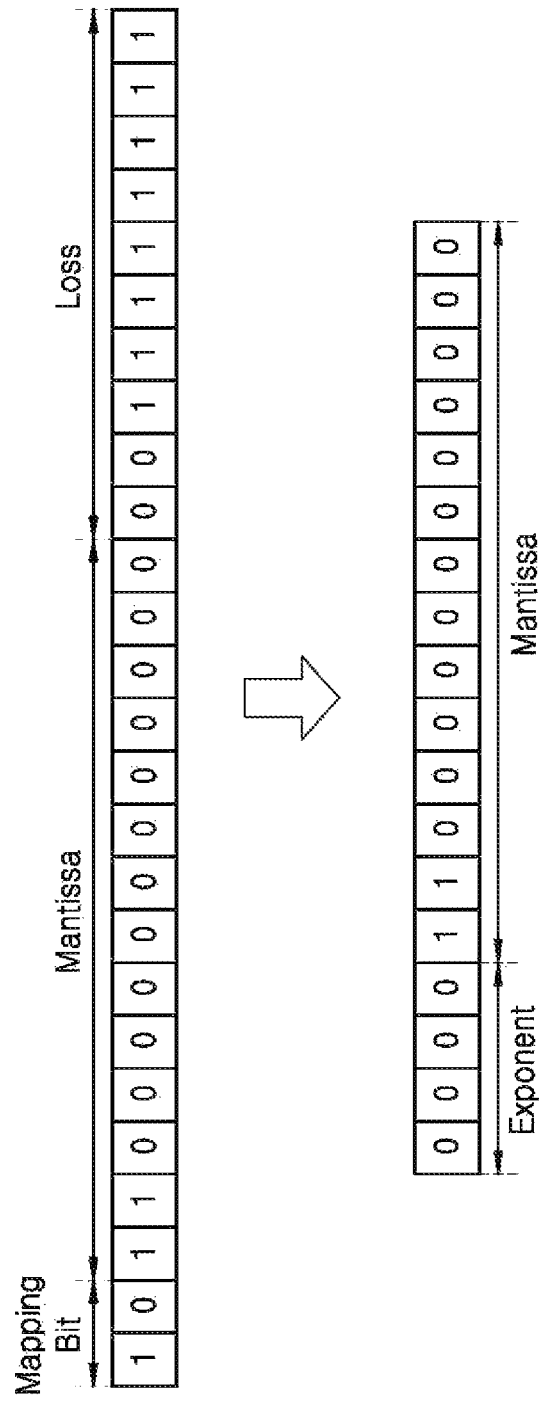
FIG. 5 is a view of compressing of a fixed-point digital signal into a floating-point digital signal, according to an example embodiment of the inventive concept.

FIG. 5 is a view of compressing of a fixed-point digital signal into a floating-point digital signal, according to an example embodiment of the inventive concept. Hereinafter, HIGH is indicated by '1' and LOW is indicated by '0'.

Referring to FIG. 5, it is assumed that a digital signal '1100000001111' of an in-phase component excluding sign bits is input to the compressor 220 and a digital signal '0100000001111' of a quadrature component is input to the compressor 220. Here, the compressor 220 may generate a fixed-point digital signal corresponding to '10110000000000000011111111' by alternately arranging bits of I/Q components. Also, the compressor 220 may generate an exponent bit string by reading '0000' corresponding to '10' in mapping data because the two most significant bits of the fixed-point digital signal correspond to '10'. Furthermore, the compressor 220 may read 14 bits '11000000000000' from the next bit of the two most significant bits to generate a mantissa bit string. In addition, the compressor 220 may generate a 20-bit floating-point digital signal by combining the sign bits, the exponent bit string, and the mantissa bit string. The 20-bit floating-point digital signal generated in the example of FIG. 5 will correspond to '000011000000000000' except for the sign bits (two bits). From the next bits of the mantissa bit strings, it can be a lost bit leaked during compression. Therefore, in the example of FIG. 5, 10 bits (5 bits of an in-phase component and 5 bits of a quadrature component) of data corresponding to '0011111111' may be lost.

Figure 6:
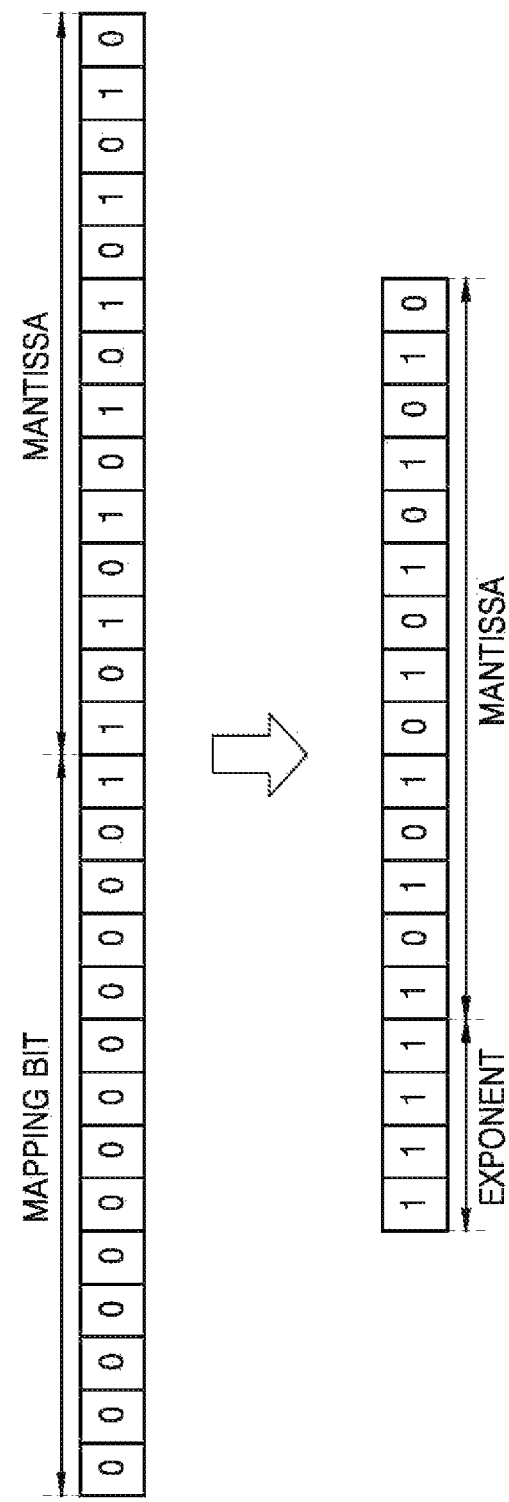
FIG. 6 is a view of compressing of a fixed-point digital signal into a floating-point digital signal, according to another example embodiment of the inventive concept.

FIG. 6 is a view of compressing of a fixed-point digital signal into a floating-point digital signal, according to another example embodiment of the inventive concept.

Referring to FIG. 6, it is assumed that a digital signal '0000001111111' of an in-phase component excluding sign bits is input to the compressor 220 and a digital signal '0000010000000' of a quadrature component is input to the compressor 220. Here, the compressor 220 may generate a fixed-point digital signal corresponding to '00000000000110101010101010' by alternately arranging bits of I/Q components. Also, the compressor 220 may generate an exponent bit string by reading '1111' corresponding to '000000000001' in mapping data because the most significant 12 bits of the fixed-point digital signal correspond to '000000000001'. Furthermore, the compressor 220 may read 14 bits '10101010101010' from the next bit of the 12 most significant bits to generate a mantissa bit strings. In addition, the compressor 220 may generate a 20-bit floating-point digital signal by combining the sign bits, the exponent bit string, and the mantissa bit string. The 20-bit floating-point digital signal generated in the example of FIG. 6 will correspond to '111110101010101010' except for the sign bits (two bits). From the next bits of the mantissa bit string, it can be a lost bit leaked during compression, but there is no leaked lost bit in the example of FIG. 6.

It is obvious that the bit loss may be reduced by the above-described method as compared with the conventional method. Conventionally, it has been common for a 28-bit fixed-point digital signal to be compressed into a 20-bit floating-point digital signal in which an exponent bit string is set to 3 bits and a mantissa bit strings is set to 15 bits. Here, it is possible to represent up to 11 bit strings as the exponent bit string, so that there may be no bit loss. However, since the exponent bit string is set to three and the maximum number of bit strings that can be represented as the exponent bit string is eight (000, 001, 010, 011, 100, 101, 110, and 111), at least 3 bits has to be lost. However, according to an example embodiment of the inventive concept, there may be no bit loss as shown in FIG. 6, and thus bit loss may be reduced as compared with the conventional method. Afterwards, the optical module 230 may convert a signal compressed into the 20-bit floating-point digital signal into an optical signal and transmit the optical signal to the RUs 140-*n* and/or the HUB 150 connected to the MU 130.

Hereinabove, a method of compressing a 28-bit fixed-point digital signal into a 20-bit floating-point digital signal by the data compression device 200 has been described according to an example embodiment of the inventive concept. Hereinafter, a method of decompressing a 20-bit floating-point digital signal received from the RUs 140-*n* and/or the HUB 150 into a 28-bit fixed-point digital signal by the data compression device 200 will be described according to an example embodiment of the inventive concept. Since the operation performed by the data compression device 200 is a 'decompressing operation', the data compression device 200 is referred to as a data decompression device 200 in order to distinguish the decompressing operation from the compressing operation.

The optical module 230 of the data decompression device 200 may convert the 20-bit floating point digital signal received from the RUs 140-*n* and/or the HUB 150 into a digital signal and output the digital signal to the decompressor 240.

The decompressor 240 may read an exponent bit string from the input 20-bit floating point digital signal. Two bits of the input 20-bit floating-point digital signal may correspond sign bits. Accordingly, the decompressor 240 may read a bit string corresponding to the exponent bit string from an 18-bit floating point signal excluding the sign bits. The decompressor 240 may generate n most significant bits by comparing the read exponent bit string with the pre-stored mapping data. The pre-stored mapping data may be the same as the mapping data used when the compressor 220 generates the 20-bit floating-point digital signal. Furthermore, the decompressor 240 may generate the 28-bit fixed-point digital signal by combining the sign bits, the generated n most significant bits, and a mantissa bit string (remaining bits excluding the sign bits and the exponent bit string). Here, the decompressor 240 may restore lost bits by a predetermined method when a value obtained by combining all of the sign bits, the generated the n most significant bits, and the mantissa bit string is less than 28 bits. A method of decompressing the received 20-bit floating-point digital signal into the 28-bit fixed-point digital signal by the decompressor 240 will be described later below in detail with reference to FIG. 7.

Figure 7:
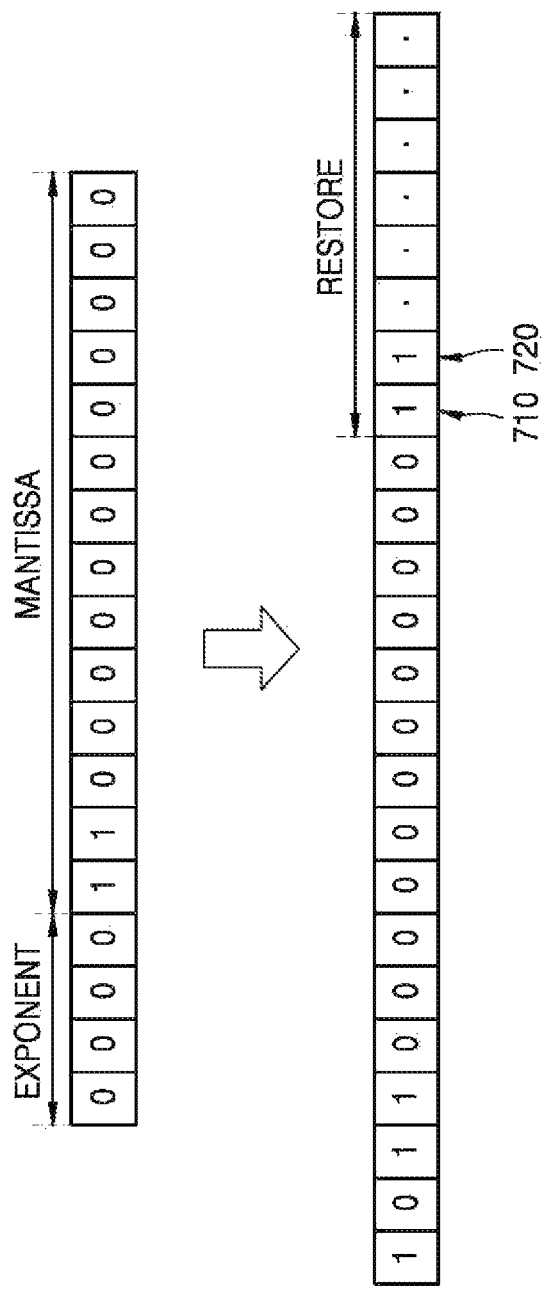
FIG. 7 is a view of decompressing of a floating-point digital signal into a fixed-point digital signal, according to an example embodiment of the inventive concept.

FIG. 7 is a view of decompressing of a floating-point digital signal into a fixed-point digital signal, according to an example embodiment of the inventive concept.

FIG. 7 shows an example of receiving a 20-bit floating point digital signal by the decompressor 240, in which 18 bits excluding two sign bits correspond to '000011000000000000'. The decompressor 240 may read 4 most significant bits in the digital signal as an exponent bit string. In FIG. 7, 4 most significant bits '0000' excluding the sign bits may be read as the exponent bit string. The decompressor 240 may read mapping a bit string corresponding to the exponent bit string from pre-stored mapping data. In FIG. 7, the mapping bit string '10' corresponding to '0000' may be read as 2 most significant bits.

In addition, the decompressor 240 may read remaining bits excluding the sign bits and the exponent bit string from among the received 20-bit floating point digital signal as the mantissa bit string. In FIG. 7, the mantissa bit string corresponding to '11000000000000' may be read. The decompressor 240 may generate the 28-bit fixed-point digital signal by combining the sign bits, the 2 most significant bits, and the mantissa bit string. In FIG. 7, the decompressor 240 may generate a bit string corresponding to '1011000000000000' by combining the 2 most significant bits and the mantissa bit string. This means that 10 bits are lost even if two sign bits are added.

Here, the decompressor 240 may generate a lost bit string according to a predetermined method. The decompressor 240 may restore a most significant bit of an in-phase component in the lost bit string to '1'. Furthermore, the decompressor 240 may restore a most significant bit of a quadrature component in the lost bit strings to '1'. In addition, the decompressor 240 may restore up to a least significant bit from a next most significant bit of the in-phase component in the lost bit string to '0'. Also, the decompressor 240 may restore up to a least significant bit from a next most significant bit of the quadrature component in the lost bit string to '0'. The decompressor 240 does not know what the original data of the lost bit string is. However, the maximum value of the lost bit string is obtained when all bits are '1', and the minimum value is obtained when all bits are '0'. Accordingly, the decompressor 240 may restore the most significant bit of the in-phase component in the lost bit string to '1' and remaining bits to '0', and restore the most significant bit of the quadrature component to '1' and remaining bits to '0' in order that the lost bit string has a value corresponding to an average of the maximum value and the minimum value.

In FIG. 7, the decompressor 240 may generate a lost bit string corresponding to 10 bits. Accordingly, the decompressor 240 may restore a most significant bit 710 of an in-phase component in the lost bit strings to '1' and a most significant bit 720 of a quadrature component to '1', and then may restore remaining 8 bits to '0'. In FIG. 7, the decompressor 240 may generate the lost bit string corresponding to '1100000000'. The decompressor 240 may then generate a 28-bit fixed-point digital signal by combining the sign bits, the 2 most significant bits, the mantissa bit string, and the lost bit string. In FIG. 7, the decompressor 240 may generate a fixed-point digital signal corresponding to '1011000000000001100000000' except for the sign bits.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope of the disclosure as defined by the following claims.

What is claimed is:

1. A data compression device comprising:
an analog to digital converter (ADC) configured to convert an analog signal into a digital signal including in-phase and quadrature components; and
a compressor configured to:
generate a 28-bit fixed-point digital signal in which bits of the in-phase and quadrature components are alternately arranged;
generate an exponent bit string by comparing n most significant bits of a data bit string excluding two sign bits in the 28-bit fixed-point digital signal with preset mapping data, wherein the exponent bit string includes 4 bits;
generate a mantissa bit string composed of 14 bits corresponding to up to 14th bit from a bit next to the n most significant bits of the data bit string; and
generate a 20-bit floating point digital signal by combining the two sign bits, the exponent bit string, and the mantissa bit string,
wherein n is a natural number equal to or greater than 2 and equal to or less than 12.

2. The data compression device of claim 1, wherein, if there is no mapping bit string corresponding to the n most significant bits in the mapping data, the compressor is configured to determine whether there are mapping bit string corresponding to n+1 most significant bits and generate the exponent bit string.

3. The data compression device of claim 1, wherein the mapping data includes two mapping bit strings corresponding to two bits.

4. The data compression device of claim 1, wherein the mapping data includes two mapping bit strings corresponding to three bits.

5. The data compression device of claim 1, wherein the mapping data includes two mapping bit strings corresponding to four bits.

6. The data compression device of claim 1, wherein the mapping data includes three mapping bit strings corresponding to five bits.

7. A data decompression device comprising:
a decompressor configured to:
receive a 20-bit floating point digital signal composed of two sign bits, a 4-bit exponent bit string, and a 14-bit mantissa bit string;
generate n most significant bits by comparing the 4-bit exponent bit string with preset mapping data; and
generate and output a 28-bit fixed-point digital signal in which bits of in-phase and quadrature components are alternately arranged by combining the two sign bits, the 14-bit mantissa bit string and the n most significant bits; and a digital to analog converter (DAC) configured to convert the 28-bit fixed-point digital signal into an analog signal, wherein n is a natural number equal to or greater than 2 and equal to or less than 12.

8. The data decompression device of claim 7, wherein the mapping data includes two mapping bit strings corresponding to two bits.

9. The data decompression device of claim 7, wherein the mapping data includes two mapping bit strings corresponding to three bits.

10. The data decompression device of claim 7, wherein the mapping data includes two mapping bit strings corresponding to four bits.

11. The data decompression device of claim 7, wherein the mapping data includes three mapping bit strings corresponding to five bits.

12. The data decompression device of claim 7, wherein, when a value obtained by combining the two sign bits, the 14-bit mantissa bit string, and the n most significant bits is less than 28 bits, the decompressor is configured to generate a lost bit string corresponding to a number of insufficient bits, and generate the 28-bit fixed-point digital signal by combining the two sign bits, the n most significant bits, the 14-bit mantissa bit string, and the lost bit string, wherein a most significant bit of the in-phase component or the quadrature component constituting the lost bit string corresponds to HIGH.

13. The data decompression device of claim 12, wherein up to a least significant bit from a next most significant bit each of the in-phase and quadrature components constituting the lost bit string correspond to LOW.

* * * * *